(12) United States Patent
Liu et al.

(10) Patent No.: US 6,287,961 B1
(45) Date of Patent: *Sep. 11, 2001

(54) DUAL DAMASCENE PATTERNED CONDUCTOR LAYER FORMATION METHOD WITHOUT ETCH STOP LAYER

(75) Inventors: Chung-Shi Liu; Chen-Hua Yu, both of Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 09/225,380

(22) Filed: Jan. 4, 1999

(51) Int. Cl.[7] .................. H01L 21/4763; H01L 21/31; H01L 21/469

(52) U.S. Cl. .................. 438/638; 438/637; 438/783; 438/924

(58) Field of Search .................. 438/623, 624, 438/740, 924, 637, 638, 783

(56) References Cited

U.S. PATENT DOCUMENTS

| | | | |
|---|---|---|---|
| 4,377,437 | 3/1983 | Taylor et al. | 156/628 |
| 4,450,041 | * 5/1984 | Aklufi | 156/628 |
| 4,634,494 | 1/1987 | Taji et al. | 156/628 |
| 4,652,334 | 3/1987 | Jain et al. | 156/628 |
| 4,863,556 | 9/1989 | Reichert | 156/628 |
| 5,444,007 | 8/1995 | Tsuchiaki | 437/35 |
| 5,460,693 | 10/1995 | Moslehi | 156/662.1 |
| 5,550,405 | 8/1996 | Cheung et al. | 257/642 |
| 5,578,523 | 11/1996 | Fiordalice et al. | 437/190 |

(List continued on next page.)

*Primary Examiner*—Charles Bowers
*Assistant Examiner*—Nema Berezny

(74) *Attorney, Agent, or Firm*—George O. Saile; Stephen B. Ackerman; Stephen G. Stanton

(57) ABSTRACT

A method for forming through a dielectric layer a trench contiguous with a via. There is provided a substrate having a contact region formed therein. There is then formed upon the substrate a patterned first dielectric layer defining a via accessing the contact region, where the patterned first dielectric layer is formed of a first dielectric material which is not susceptible to etching with an oxygen containing plasma. There is then formed completely covering the patterned first dielectric layer and filling the via a the blanket second dielectric layer formed of a second dielectric material which is susceptible to etching within the oxygen containing plasma. There is then formed upon the blanket second dielectric layer a blanket hard mask layer formed from a hard mask material which is not susceptible to etching within the oxygen containing plasma. There is then formed upon the blanket hard mask layer a patterned photoresist layer which provides an exposed portion of the blanket hard mask layer greater that an areal dimension of the via and at least partially overlapping the areal dimension of the via. There is then implanted into the exposed portion of the blanket hard mask layer and into a portion of the blanket second dielectric layer aligned beneath the exposed portion of the blanket hard mask layer a dose of an ion to form an ion implanted portion of the blanket hard mask layer and an ion implanted portion of the blanket second dielectric layer, where the ion implanted portion of the blanket second dielectric layer has an enhanced etch rate within the oxygen containing plasma in comparison with a non ion implanted portion of the blanket second dielectric layer. There is then etched while employing a first plasma etch method the ion implanted portion of the blanket hard mask layer to form a patterned hard mask layer. Finally, there is then etched while employing a second plasma etch method employing the oxygen containing plasma the blanket second dielectric layer to form a patterned second dielectric layer having an aperture formed therethrough, where the aperture comprises a trench and at least a portion of the via.

45 Claims, 5 Drawing Sheets

U.S. PATENT DOCUMENTS

| | | | |
|---|---|---|---|
| 5,602,053 | 2/1997 | Zheng et al. | 437/60 |
| 5,612,254 | 3/1997 | Mu et al. | 437/195 |
| 5,614,765 | 3/1997 | Avanzino et al. | 257/774 |
| 5,635,423 | 6/1997 | Huang et al. | 437/195 |
| 5,651,855 | 7/1997 | Dennison et al. | 156/636.1 |
| 5,686,354 | 11/1997 | Avanzino et al. | 437/190 |
| 5,705,430 | 1/1998 | Avanzino et al. | 437/195 |
| 5,985,753 * | 8/1998 | Yu et al. | 438/637 |
| 6,004,883 * | 12/1999 | Yu | 438/706 |

* cited by examiner

DUAL DAMASCENE PATTERNED CONDUCTOR LAYER FORMATION METHOD WITHOUT ETCH STOP LAYER

CROSS-REFERENCE TO RELATED APPLICATIONS

This application is related to a co-assigned application Ser. No. 09/177,186, filed Oct. 23, 1998, and a co-assigned application Ser. No. 09/177,187, filed Oct. 23, 1998, both similarly titled "Dual Damascene Patterned Conductor Layer Formation Method Without Etch Stop Layer," the teachings of both of which are incorporated herein fully by reference.

BACKGROUND OF THE INVENTION

1. Field of the Invention

The present invention relates generally to methods for forming patterned conductor layers separated by patterned dielectric layers within microelectronics fabrications. More particularly, the present invention relates to dual damascene methods for forming patterned conductor layers separated by patterned dielectric layers within microelectronics fabrications.

2. Description of the Related Art

Microelectronics fabrications are formed from microelectronics substrates over which are formed patterned microelectronics conductor layers which are separated by microelectronics dielectric layers.

As microelectronics integration levels have increased and microelectronics device and patterned conductor layer dimensions have decreased, it has become increasingly common within the art of microelectronics fabrication to employ interposed between the patterns of narrow linewidth dimension and/or narrow pitch dimension patterned microelectronics conductor interconnect layers within microelectronics fabrications microelectronics dielectric layers formed of low dielectric constant dielectric materials. Such patterned microelectronics conductor interconnect layers often access within the microelectronics fabrications within which they are formed patterned conductor contact stud layers or patterned conductor interconnect stud layers. For the purposes of the present disclosure, low dielectric constant dielectric materials are intended as dielectric materials having a dielectric constant of less than about 3.0. For comparison purposes, dielectric layers formed employing conventional silicon oxide dielectric materials, silicon nitride dielectric materials or silicon oxynitride dielectric materials typically have dielectric constants in the range of from about 4.0 to about 9.0.

Microelectronics dielectric layers formed of low dielectric constant dielectric materials are desirable interposed between the patterns of narrow linewidth dimension and/or narrow pitch dimension patterned microelectronics conductor layers within microelectronics fabrications since such dielectric layers formed from such low dielectric constant dielectric materials provide dielectric layers which assist in providing microelectronics fabrications exhibiting enhanced microelectronics fabrication speed, attenuated patterned microelectronics conductor layer parasitic capacitance, and attenuated patterned microelectronics conductor layer crosstalk.

Low dielectric constant dielectric materials which may be employed for forming low dielectric constant microelectronics dielectric layers within microelectronics fabrications are typically materials with hydrogen and/or carbon content, such as but not limited to organic polymer spin-on-polymer dielectric materials (such as but not limited to polyimide organic polymer spin-on-polymer dielectric materials, poly-arylene-ether organic polymer spin-on-polymer dielectric materials, and fluorinated poly-arylene-ether organic polymer spin-on-polymer dielectric materials), amorphous carbon dielectric materials (such as but not limited to amorphous carbon and fluorinated amorphous carbon), and silsesqiuoxane spin-on-glass (SOG) dielectric materials (such as but not limited to hydrogen silsesquioxane spin-on-glass (SOG) dielectric materials, carbon bonded hydrocarbon silsesquioxane spin-on-glass (SOG) dielectric materials, and carbon bonded fluorocarbon silsesquioxane spin-on-glass (SOG) dielectric materials).

While organic polymer spin-on-polymer dielectric materials, amorphous carbon dielectric materials, and silsesquioxane spin-on-glass (SOG) dielectric materials are thus desirable within the art of microelectronics fabrication for forming patterned low dielectric constant microelectronics dielectric layers interposed between the patterns of patterned conductor interconnect layers which access patterned conductor stud layers within microelectronics fabrications, such microelectronics fabrication structures are often not formed entirely without problems. In particular, such microelectronics fabrication structures are typically formed employing an etch stop layer formed interposed between: (1) a patterned first dielectric layer through which is formed a patterned conductor stud layer; and (2) a patterned low dielectric constant dielectric layer which is formed adjoining the patterned conductor interconnect layer which contacts the patterned conductor stud layer. The etch stop layer typically assures optimal definition of the patterned conductor interconnect layer within respect to the patterned conductor stud layer. Unfortunately, the presence of such etch stop layers often provides additional microelectronics fabrication complexity within microelectronics fabrications within which are formed patterned conductor interconnect layers which contact patterned conductor stud layers. Similarly, even with the presence of such etch stop layers, it is often difficult to form patterned conductor stud layers, and more particularly patterned conductor interconnect layers, with enhanced linewidth control.

It is thus towards the goal of forming microelectronics fabrication structures comprising patterned low dielectric constant dielectric layers separating patterned conductor interconnect layers which in turn contact patterned conductor stud layers, with attenuated microelectronics fabrication complexity and with enhanced linewidth control, that the present invention is directed.

Various methods have been disclosed in the art of microelectronics fabrication for forming patterned microelectronics layers within microelectronics fabrications.

For example, several ion implant assisted methods have been disclosed within the art of microelectronics fabrication for forming patterned microelectronics layers within microelectronics fabrications. Examples of such methods are disclosed by: (1) Taylor et al., in U.S. Pat. No. 4,377,437 (ion implant method where ion implanted portions of a substrate layer react with a reactant within a reactant atmosphere to form a protective compound within the ion implanted portions of the substrate layer, which ion implanted portions are inhibited from further etching within the reactant atmosphere); (2) Taji et al., in U.S. Pat. No. 4,634,494 (ion implant method employing boron ions implanted into a phosphosilicate glass layer to selectively modify the etch properties of the boron doped phosphosilicate glass layer so formed); (3) Jain et al., in U.S. Pat. No.

4,652,334 (ion implant method which facilitates selective etching of ion implanted portions of a silicon oxide layer within an ammoniacal hydrogen peroxide etchant); (4) Reichert et al., in U.S. Pat. No. 4,863,556 (ion implant method which facilitates selective etching of ion implanted portions of a silicon oxide layer and an underlying silicon nitride layer within phosphoric acid); and (5) Tsuhchiaki, in U.S. Pat. No. 5,444,007 (ion implant method for simultaneously forming narrow trenches with straight sidewalls and wide trenches with tapered sidewall profiles within substrates).

In addition, Moslehi, in U.S. Pat. No. 5,460,693, discloses a fully dry microlithography method for forming a patterned processable layer within a microelectronics fabrication, where the fully dry microlithography method is predicated upon photosensitive properties of a halogen doped layer employed as a mask layer within the fully dry microlithography method.

Further, Cheung et al., in U.S. Pat. No. 5,550,405, discloses a lift off method employing a tri-layer resist layer for forming an interconnect structure employing a low resistance metal layer separated by a low dielectric constant dielectric layer within a microelectronics fabrication. Within the method, a low dielectric constant dielectric material employed within the low dielectric constant dielectric layer is employed as a diffusion barrier to diffusion of a low resistance metal employed within the low resistance metal layer.

Finally, there is also disclosed in the art several damascene and dual damascene methods for forming patterned conductor interconnect layers, optionally contiguous with patterned conductor stud layers, within microelectronics fabrications. Examples of such methods are disclosed by: (1) Fiordalice et al., U.S. Pat. No. 5,578,523 (damascene method employing an aluminum nitride polish assisting layer to attenuate dishing or cusping of a chemical mechanical polish (CMP) planarized conductor interconnect layer formed employing the damascene method); (2) Zheng et al., in U.S. Pat. No. 5,602,053 (dual damascene method incorporating an antifuse structure within a dual damascene structure); (3) Mu et al., in U.S. Pat. No. 5,612,254 (damascene method for forming a patterned conductor interconnect layer contacting a patterned conductor stud layer within a microelectronics fabrication); (4) Huang et al., in U.S. Pat. No. 5,635,423 (modified dual damascene method employing an etch stop layer interposed between a first dielectric layer through which is formed a patterned conductor stud layer and a second dielectric layer through which is formed a patterned conductor interconnect layer); (5) Dennison et al., in U.S. Pat. No. 5,651,855 (dual damascene method employing a single insulator layer with two separate masking and etching process steps); (6) Avanzino et al., in U.S. Pat. No. 5,686,354 (dual damascene method employing a single dielectric layer and a conformal trench masking layer); (7) Avanzino et al., in U.S. Pat. No. 5,705,430 (a dual damascene method employing two insulator layers and sacrificial via fill layer); and (8) Avanzino et al., in U.S. Pat. No. 5,614,765 (a dual damascene method where a conductor stud layer is formed in a via formed in a self aligned fashion).

Desirable in the art of microelectronics fabrication are methods through which there may be formed within microelectronics fabrications low dielectric constant dielectric layers interposed between the patterns of patterned conductor interconnect layers which in turn contact patterned conductor stud layers, with attenuated process complexity and with enhanced linewidth control.

It is towards the foregoing objects that the present invention is both generally and more specifically directed.

SUMMARY OF THE INVENTION

A first object of the present invention is to provide a method for forming within a microelectronics fabrication a patterned low dielectric constant dielectric layer adjoining a patterned conductor interconnect layer which in turn contacts a patterned conductor stud layer.

A second object of the present invention is to provide a method in accord with the first object of the present invention, where the method provides for attenuated process complexity and enhanced linewidth control.

A third object of the present invention is to provide a method in accord with the first object of the present invention or the second object of the present invention, where the microelectronics fabrication is a semiconductor integrated circuit microelectronics fabrication.

A fourth object of the present invention is to provide a method in accord with the first object of the present invention, the second object of the present invention or the third object of the present invention, which method is readily commercially implemented.

In accord with the objects of the present invention there is provided a method for forming through a dielectric layer within a microelectronics fabrication a trench contiguous with a via, into which trench and via may be formed a patterned conductor interconnect layer contiguous with a patterned conductor stud layer. To practice the method of the present invention, there is first provided a substrate having a contact region formed therein. There is then formed upon the substrate a patterned first dielectric layer, where the patterned first dielectric layer defines a via accessing the contact region, and where the patterned first dielectric layer is formed of a first dielectric material which is not susceptible to etching with an oxygen containing plasma. There is then formed upon the patterned first dielectric layer a blanket second dielectric layer, where the blanket second dielectric layer completely covers the patterned first dielectric layer and fills the via, and where the blanket second dielectric layer is formed of a second dielectric material which is susceptible to etching within the oxygen containing plasma. There is then formed upon the blanket second dielectric layer a blanket hard mask layer, where the blanket hard mask layer is formed from a hard mask material which is not susceptible to etching within the oxygen containing plasma. There is then formed upon the blanket hard mask layer a patterned photoresist layer, where the patterned photoresist layer provides an exposed portion of the blanket hard mask layer greater that an areal dimension of the via and at least partially overlapping the areal dimension of the via. There is then implanted into the exposed portion of the blanket hard mask layer and into a portion of the blanket second dielectric layer aligned beneath the exposed portion of the blanket hard mask layer a dose of an ion to form an ion implanted portion of the blanket hard mask layer and an ion implanted portion of the blanket second dielectric layer, where the ion implanted portion of the blanket second dielectric layer has an enhanced etch rate within the oxygen containing plasma in comparison with a non ion implanted portion of the blanket second dielectric layer. There is then etched while employing a first plasma etch method the ion implanted blanket hard mask layer to form a patterned hard mask layer defining a first trench formed through the patterned hard mask layer while employing the patterned photoresist layer as a first etch mask layer, where the first plasma etch method employs a first etchant gas composition appropriate to the ion implanted portion of the blanket hard mask layer. Finally, there is then etched while employing a second plasma etch method the blanket second dielectric layer to form a patterned second dielectric layer having an aperture formed therethrough, where the aperture comprises: (1) a second trench corresponding with the first trench; and (2) at least a portion of the via, and where the second plasma etch method employs the oxygen containing plasma.

The present invention provides a method for forming within a microelectronics fabrication a patterned low dielectric constant dielectric layer adjoining a patterned conductor interconnect layer which in turn contacts a patterned conductor stud layer, where the method provides for attenuated process complexity and enhanced linewidth control. The method of the present invention realizes attenuated process complexity by employing when forming the patterned low dielectric constant dielectric layer a low dielectric constant dielectric material which is etchable within an oxygen containing plasma. The patterned low dielectric constant dielectric layer so formed is formed upon a patterned first dielectric layer which is not etchable within the oxygen containing plasma, where the patterned first dielectric layer defines a via accessing a contact region within a substrate layer formed beneath the patterned first dielectric layer. Thus, when employing an appropriate hard mask layer and an oxygen containing plasma etch method employing the oxygen containing plasma, there may be formed without employing an etch stop layer interposed between the patterned first dielectric layer and the low dielectric constant dielectric layer an aperture through the low dielectric constant dielectric layer and the patterned first dielectric layer, which aperture comprises: (1) a trench within the low dielectric constant dielectric layer; and (2) at least a portion of the via. The aperture so formed may subsequently have formed therein a patterned conductor interconnect layer contiguous with a patterned conductor stud layer while employing a damascene method. Thus, the present invention provides a method for forming within a microelectronics fabrication a patterned low dielectric constant dielectric layer adjoining a patterned conductor interconnect layer which in turn contacts and is contiguous with a patterned conductor stud layer, where the method provides for attenuated process complexity. The enhanced linewidth control of the present invention is realized by employing an ion implanting of a portion of the blanket second dielectric layer such that the ion implanted portion of the blanket second dielectric layer exhibits an enhanced etch rate within the oxygen containing plasma in comparison with a non-ion implanted portion of the blanket second dielectric layer. Thus, any lateral etching of the blanket second dielectric layer within the oxygen containing plasma, with attendant loss of linewidth control, is attenuated.

The present invention may be employed where the microelectronics fabrication is a semiconductor integrated circuit microelectronics fabrication. The present invention does not discriminate with respect to the nature of a microelectronics fabrication within which is formed a patterned low dielectric constant dielectric layer interposed between the patterns of a patterned conductor interconnect layer which in turn contacts a patterned conductor stud layer. Thus, although the method of the present invention may be employed when forming patterned low dielectric constant dielectric layers interposed between the patterns of patterned conductor interconnect layers which in turn contact patterned conductor stud layers within semiconductor integrated circuit microelectronics fabrications, the method of the present invention may also be employed in forming patterned low dielectric constant dielectric layers interposed between the patterns of patterned conductor interconnect layers which in turn contact patterned conductor stud layers within microelectronics fabrications including but not limited to semiconductor integrated circuit microelectronics fabrications, solar cell microelectronics fabrications, ceramic substrate microelectronics fabrications and flat panel display microelectronics fabrications.

The present invention is readily commercially implemented. The method of the present invention employs methods and materials which are otherwise generally known in the art of microelectronics fabrication. Since it is a novel ordering and use of methods and materials which provides the method of the present invention, rather than the existence of the methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein:

FIG. 4b shows a schematic plan view diagram corresponding with the schematic cross-sectional diagram of FIG. 4a.

DESCRIPTION OF THE PREFERRED EMBODIMENT

Figure 1:
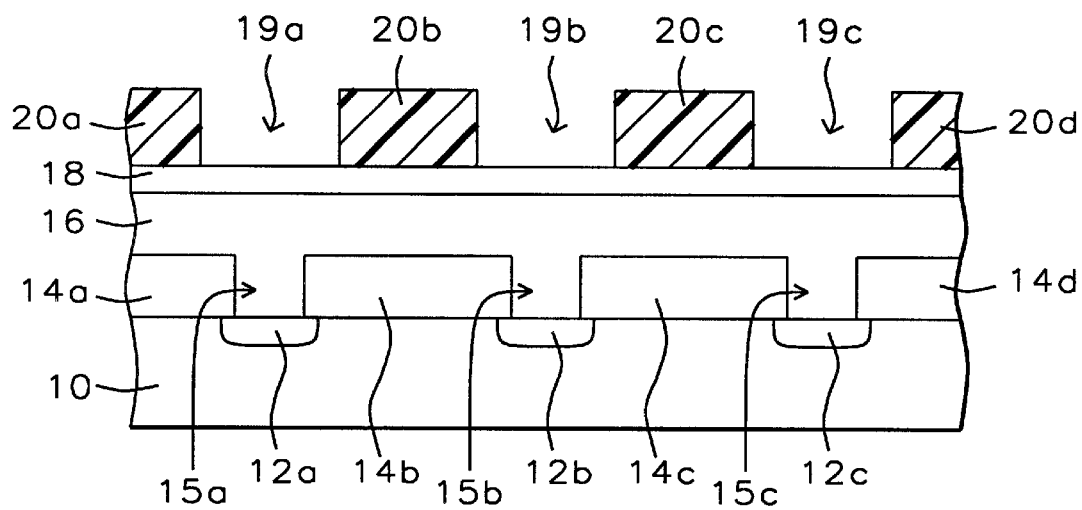
FIG. 1, FIG. 2, FIG. 3, FIG. 4a, FIG. 5, FIG. 6, FIG. 7, FIG. 8 and FIG. 9 show a series of schematic cross-sectional diagrams illustrating the results of forming within a microelectronics fabrication in accord with a preferred embodiment of the present invention two series of patterned low dielectric constant dielectric layers interposed between two series of patterned conductor interconnect layers in turn contacting two series of patterned conductor stud layers, in accord with the present invention.

The present invention provides a method for forming within a microelectronics fabrication a patterned low dielectric constant dielectric layer adjoining a patterned conductor interconnect layer which in turn contacts a patterned conductor stud layer, where the method provides for attenuated process complexity and enhanced linewidth control. The method of the present invention realizes attenuated process complexity by employing when forming the patterned low dielectric constant dielectric layer a low dielectric constant dielectric material which is etchable within an oxygen containing plasma. The patterned low dielectric constant dielectric layer so formed is formed upon a patterned first dielectric layer which is not etchable within the oxygen containing plasma, where the patterned first dielectric layer defines a via accessing a contact region within a substrate layer formed beneath the patterned first dielectric layer. Thus, when employing an appropriate hard mask layer and an oxygen containing plasma etch method employing the oxygen containing plasma, there may be formed without employing an etch stop layer interposed between the patterned first dielectric layer and the low dielectric constant dielectric layer an aperture through the low dielectric constant dielectric layer and the patterned first dielectric layer, where the aperture comprises: (1) a trench within the low dielectric constant dielectric layer; and (2) at least a portion of the via. The aperture so formed may subsequently have formed therein a patterned conductor interconnect layer contiguous with a patterned conductor stud layer while employing a damascene method. The method of the present invention realizes enhanced linewidth control by employing an ion implanting of a portion of the blanket second dielectric layer such that the ion implanted portion of the blanket second dielectric layer etches faster within the oxygen containing plasma in comparison with a non ion implanted portion of the blanket second dielectric layer.

The present invention does not discriminate with respect to the nature of a microelectronics fabrication within which is formed a patterned low dielectric constant dielectric layer interposed between the patterns of a patterned conductor interconnect layer which in turn contacts a patterned conductor stud layer. Thus, although the method of the present invention may be employed when forming patterned low dielectric constant dielectric layers interposed between the patterns of patterned conductor interconnect layers which in turn contact patterned conductor stud layers within semiconductor integrated circuit microelectronics fabrications, the method of the present invention may also be employed in forming patterned low dielectric constant dielectric layers interposed between the patterns of patterned conductor interconnect layers which in turn contact patterned conductor stud layers within microelectronics fabrications including but not limited to semiconductor integrated circuit microelectronics fabrications, solar cell microelectronics fabrications, ceramic substrate microelectronics fabrications and flat panel display microelectronics fabrications.

Referring now to FIG. 1 to FIG. 9, there is shown a series of schematic cross-sectional and schematic plan-view diagrams illustrating the results of forming within a microelectronics fabrication in accord with a preferred embodiment of the present invention two series of patterned low dielectric constant dielectric layers interposed between two series of patterned conductor interconnect layers which in turn contact two series of patterned conductor stud layers, formed in accord with the present invention. Shown in FIG. 1 is a schematic cross-sectional diagram of the microelectronics fabrication at an early stage in its fabrication in accord with the present invention.

Shown in FIG. 1 is a substrate 10 employed within a microelectronics fabrication, where the substrate 10 has formed therein a series of contact regions 12a, 12b, and 12c. Within the preferred embodiment of the present invention, the substrate 10 may be a substrate employed within a microelectronics fabrication including but not limited to a semiconductor integrated circuit microelectronics fabrication, a solar cell microelectronics fabrication, a ceramic substrate microelectronics fabrication or a flat panel display microelectronics fabrication. Although not specifically illustrated within the schematic cross-sectional diagram of FIG. 1, the substrate 10 may be the substrate itself employed within the microelectronics fabrication, or in the alternative, the substrate 10 may be the substrate employed within the microelectronics fabrication, where the substrate has any of several additional layers formed thereupon or thereover as are conventional within the microelectronics fabrication within which is employed the substrate. Such additional microelectronics layers may include, but are not limited to, microelectronics conductor layers, microelectronics semiconductor layers and microelectronics dielectric layers.

With respect to the contact regions 12a, 12b, and 12c formed within the substrate 10, the contact regions 12a, 12b, and 12c will typically be either conductor contact regions or semiconductor contact regions within the microelectronics fabrication within which is employed the substrate 10. More preferably, within the present invention when the substrate 10 is a semiconductor substrate alone employed within a semiconductor integrated circuit microelectronics fabrication, and the contact regions 12a, 12b, and 12c are semiconductor substrate contact regions which are typically employed when forming semiconductor integrated circuit devices employing the substrate 10.

Shown also within FIG. 1 formed upon the substrate 10 is a series of patterned first dielectric layers 14a, 14b, 14c, and 14d which define a series of first vias 15a, 15b, and 15c which in turn access the series of contact regions 12a, 12b, and 12c. Within the first preferred embodiment of the present invention, the series of patterned first dielectric layers 14a, 14b, 14c, and 14d is formed of a first dielectric material which is not susceptible to etching within an oxygen containing plasma but provides an appropriate barrier for the substrate 10 and/or portions of the contact regions 12a, 12b and 12c covered by the series of patterned first dielectric layers 14a, 14b, 14c and 14d. Many dielectric materials which possess this property are known in the art of microelectronics fabrication, such dielectric materials including but not limited to silicon oxide dielectric materials, silicon nitride dielectric materials, and silicon oxynitride dielectric materials which may be formed employing methods including but not limited to chemical vapor deposition (CVD) methods, plasma enhanced chemical vapor deposition PECVD) methods and physical vapor deposition (PVD) sputtering methods. Thus, although other methods and materials may be employed, the patterned first dielectric layers 14a, 14b, 14c, and 14d are preferably formed of a silicon oxide dielectric material deposited employing a chemical vapor deposition (CVD) method, as is conventional in the art of microelectronics fabrication. Preferably, each of the patterned first dielectric layers 14a, 14b, 14c, and 14d so formed is formed to a thickness of from about 5000 to about 9000 angstroms. Preferably, each of the first vias 15a, 15b, or 15c has a linewidth of from about 0.2 to about 0.5 microns.

Also shown in FIG. 1 formed upon the patterned first dielectric layers 14a, 14b, 14c, and 14d, and portions of the contact regions 12a, 12b, and 12c exposed within the corresponding series of first vias 15a, 15b and 15c is a blanket second dielectric layer 16. Within the preferred embodiment of the present invention, the blanket second dielectric layer 16 is formed of a second dielectric material which is susceptible to etching within the oxygen containing plasma within which the patterned first dielectric layers 14a, 14b, 14c, and 14d are not susceptible to etching. For the purposes of defining an extent to which the patterned first dielectric layers 14a, 14b, 14c, and 14d are not susceptible to etching within the oxygen containing plasma while the blanket second dielectric layer 16 is susceptible to etching within the oxygen containing plasma, the blanket second dielectric layer 16 preferably has an etch rate ratio within the oxygen containing plasma with respect to the patterned first dielectric layers 14a, 14b, 14c, and 14d of greater than about 20:1, more preferably greater than about 30:1, and most preferably greater than about 50:1. Although not specifically illustrated within the schematic cross-sectional diagram of FIG. 1, the blanket second dielectric layer 16 may optionally, if desirable, be planarized employing an appropriate planarizing method.

Within the preferred embodiment of the present invention, the blanket second dielectric layer 16, which is formed of the second dielectric material which is susceptible to etching within the oxygen containing plasma, is preferably formed of a low dielectric constant dielectric material selected from the group of low dielectric constant dielectric materials comprising organic polymer spin-on-polymer dielectric materials (such as but not limited to polyimide organic polymer spin-on-polymer dielectric materials, poly-arylene-ether organic polymer spin-on-polymer dielectric materials and fluorinated poly-arylene-ether organic polymer spin-on-polymer dielectric materials). Preferably, the blanket second dielectric layer 16 is formed to a thickness of from about 4000 to about 7000 angstroms.

There is also shown in FIG. 1 a blanket first hard mask layer 18 formed upon the blanket second dielectric layer 16. Within the preferred embodiment of the present invention, the blanket first hard mask layer 18 is formed of a hard mask material which is also not susceptible to etching within the oxygen containing plasma. Similarly with the patterned first dielectric layers 14a, 14b, 14c, and 14d, there are several methods and materials which may be employed in forming the blanket first hard mask layer 18, where such methods and materials include but are not limited to thermally assisted evaporation methods, electron beam assisted evaporation methods, chemical vapor deposition (CVD) methods and physical vapor deposition (PVD) sputtering methods which may be employed for forming blanket hard mask layers from hard mask materials including but not limited to conductor hard mask materials, semiconductor hard mask materials, and insulator hard mask materials. Although the blanket first hard mask layer 18 may be formed employing any of several such methods and materials as are known in the art of microelectronics fabrication, the blanket first hard mask layer 18 is typically and preferably formed of a hard mask material analogous or equivalent to the dielectric material from which is formed the patterned first dielectric layers 14a, 14b, 14c, and 14d. Preferably, the blanket first hard mask layer 18 so formed is formed to a thickness of from about 500 to about 2000 angstroms.

Finally, there is also shown in FIG. 1 the presence of a series of patterned first photoresist layers 20a, 20b, 20c, and 20d formed upon the blanket first hard mask layer 18. Within the first preferred embodiment of the present invention, the patterned first photoresist layers 20a, 20b, 20c, and 20d may be formed from any of several photoresist materials as are generally known in the art of microelectronics fabrication, including photoresist materials selected from the general groups of photoresist materials including but not limited to positive photoresist materials and negative photoresist materials. For the preferred embodiment of the present invention, the patterned first photoresist layers 20a, 20b, 20c, and 20d are preferably formed of a positive photoresist material as is conventional in the art of microelectronics fabrication, in order to assure optimal dimensional stability. Preferably, the patterned first photoresist layers 20a, 20b, 20c, and 20d so formed are each formed to a thickness of from about 7000 to about 15000 angstroms.

Although not completely illustrated within the schematic cross-sectional diagram of FIG. 1, the patterned first photoresist layers 20a, 20b, 20c and 20d define a series of first trenches 19a, 19b, and 19c leaving exposed a portion of the blanket first hard mask layer 18 of areal dimension greater than the areal dimension of a corresponding first via 15a, 15b, or 15c, while simultaneously at least partially overlapping the areal dimension of the corresponding first vias 15a, 15b, or 15c. More preferably, as illustrated within the schematic cross-sectional diagram of FIG. 1, the areal dimension of each first trench 19a, 19b, or 19c within the series of first trenches 19a, 19b, and 19c completely overlaps and encompasses the areal dimension of a corresponding first via 15a, 15b, or 15c within the series of first vias 15a, 15b and 15c.

Figure 2:
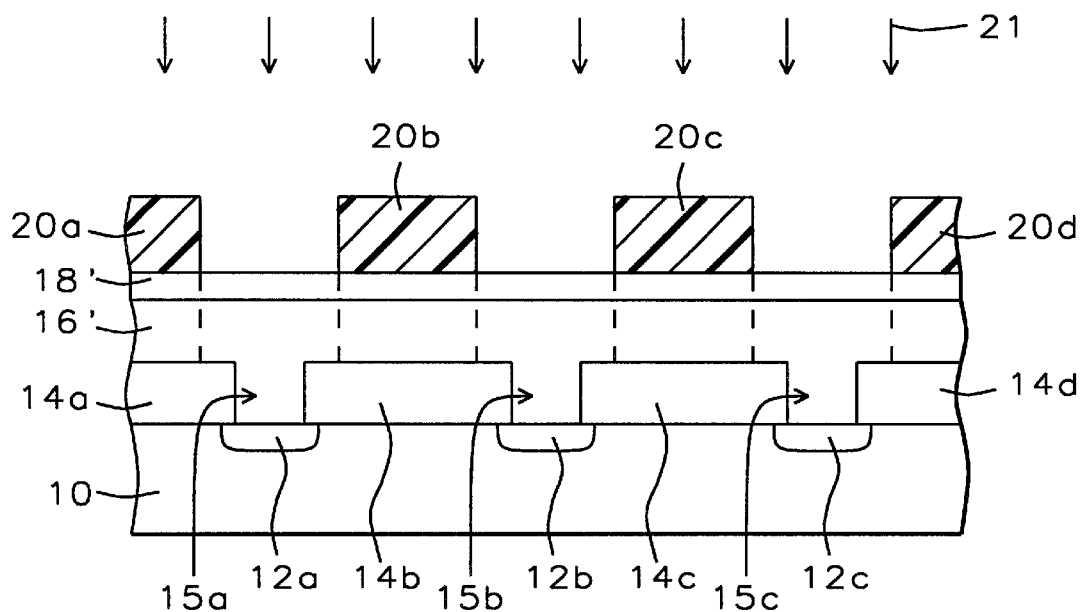

Referring now to FIG. 2, there is shown a schematic cross-sectional diagram illustrating the results of further processing of the microelectronics fabrication whose schematic cross-sectional diagram is illustrated in FIG. 1. Shown in FIG. 2 is a schematic cross-sectional diagram of a microelectronics fabrication otherwise equivalent to the microelectronics fabrication whose schematic cross-sectional diagram is illustrated in FIG. 1, but wherein: (1) portions of the blanket first hard mask layer 18 exposed adjoining the patterned first photo resist layers 20a, 20b, 20c and 20d; and (2) portions of the blanket second dielectric layer 16 immediately beneath the portions of the blanket first hard mask layer 18 exposed adjoining the patterned first photo resist layers 20a, 20b, 20c and 20d, have each been ion implanted employing a first ion implant treatment 21 to form a selectively ion implanted blanket hard mask layer 18' and a selectively ion implanted blanket second dielectric layer 16'.

Within the preferred embodiment of the present invention, the blanket second dielectric layer 16 is implanted with the first ion implant treatment 21 while employing an appropriate type, a sufficient energy and a sufficient dose of implanting ions such that the ion implanted portions of the selectively ion implanted blanket second dielectric layer 16' exhibit in comparison with non ion implanted portions of the selectively ion implanted blanket second dielectric layer 16' an enhanced etch rate within an oxygen containing plasma which is employed to form from the selectively ion implanted blanket second dielectric layer 16' a series of patterned second dielectric layers. Similarly, it may also occur within the preferred embodiment of the present invention that the ion implanted portion of the selectively ion implanted blanket hard mask layer 18' may also exhibit in comparison with a non ion implanted portion of the selectively ion implanted blanket hard mask layer 18' an enhanced etch rate within a plasma etch method which is employed to etch the selectively ion implanted blanket hard mask layer 18' to form a series of patterned hard mask layers. Optionally, it is also possible within the method of the present invention that the ion implanted portions of the selectively ion implanted blanket hard mask layer 18' will in comparison with non ion implanted portions of the selectively ion implanted blanket hard mask layer 18' also exhibit a substantially increased etch rate within the oxygen containing plasma within which is etched the selectively ion implanted blanket second dielectric layer 16' to form the series of patterned second dielectric layers.

Within the preferred embodiment of the present invention, the implanting ions employed within the first ion implant treatment 21 may be selected from any of several types of implanting ions are known in the art of microelectronics fabrication, including electrically active dopant implanting ions, such as but not limited to boron ions, boron difluoride ions, phosphorus ions and arsenic ions, as well as electrically inactive dopant implanting ions, such as but not limited to argon ions and xenon ions. As noted above, within the preferred embodiment of the present invention, the implanting ions are provided at: (1) an ion implantation dose which provides optimal etch rate differences between ion implanted portions and non ion implanted portions of at least the selectively ion implanted blanket second dielectric layer 16'; and (2) an ion implantation energy which preferably provides a peak implanted ion concentration centered within the portion of the selectively ion implanted blanket second dielectric layer 16' between the patterned first dielectric layers 14a, 14b, 14c and 14d and the selectively ion implanted blanket hard mask layer 18'. Within the preferred embodiment of the present invention when employing comparatively heavier electrically active dopant ions such as boron difluoride, phosphorus and arsenic as are common in the art of microelectronics fabrication, the first ion implant treatment 21 will typically and preferably employ an ion implant dose of from about 1E15 to about 5E16 ions per square centimeter and an ion implantation energy of from about 30 to about 200 kev.

Figure 3:
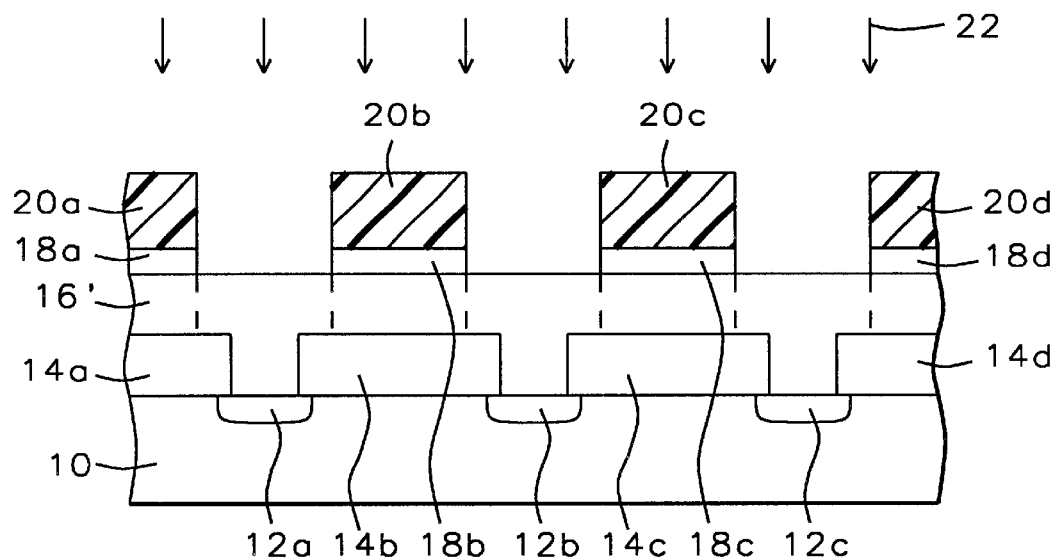

Referring now to FIG. 3, there is shown a schematic cross-sectional diagram illustrating the results of further processing of the microelectronics fabrication whose schematic cross-sectional diagram is illustrated in FIG. 2. Shown in FIG. 3 is a schematic cross-sectional diagram of a microelectronics fabrication otherwise equivalent to the microelectronics fabrication whose schematic cross-sectional diagram is illustrated in FIG. 2, but wherein the selectively ion implanted blanket first hard mask layer 18 has been patterned to form a series of patterned first hard mask layers 18a, 18b, 18c, and 18d, through etching while employing a first plasma 22 in conjunction with the patterned first photoresist layers 20a, 20b, 20c, and 20d as a first photoresist etch mask layer. Within the preferred embodiment of the present invention, the first plasma 22 preferably employs an etchant gas composition appropriate to the material from which is formed the blanket first hard mask layer 18. When the blanket first hard mask layer 18 is formed from a silicon oxide dielectric material, as is preferred within the preferred embodiment of the present invention, the first plasma 22 preferably employs an etchant gas composition which upon plasma activation provides a fluorine containing etchant species. Such etchant gas compositions include, but are not limited to fluorocarbon containing etchant gas compositions. Within the preferred embodiment of the present invention, the first plasma 22 more preferably employs a carbon tetrafluoride containing etchant gas composition, optionally containing trifluoromethane for added sidewall passivation and argon for dilution.

Preferably, the first plasma 22 is employed within a first plasma etch method which also employs: (1) a reactor chamber pressure of from about 20 to about 200 mtorr; (2) a source radio frequency power of from about 200 to about 2000 watts at a radio frequency of 13.56 MHZ; (3) a bias power of up to about 1000 watts; and (4) a carbon tetrafluoride flow rate of from about 10 to about 20 standard cubic centimeters per minute (sccm), for a time sufficient to form from the selectively ion implanted blanket first hard mask layer 18' the corresponding series of patterned first hard mask layers 18a, 18b, 18c and 18d.

Figure 4A:
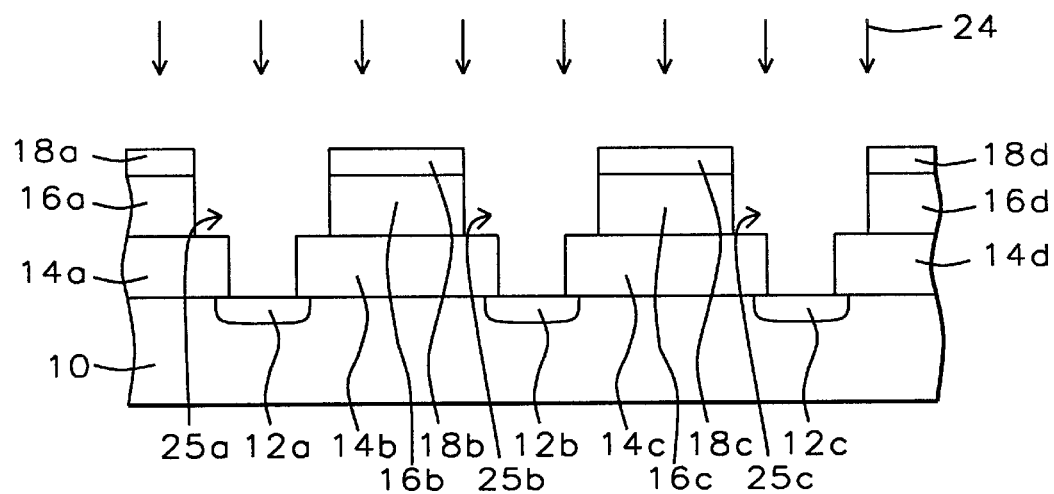

Referring now to FIG. 4a, there is shown a schematic cross-sectional diagram illustrating the results of further processing of the microelectronics fabrication whose schematic cross-sectional diagram is illustrated in FIG. 3. Shown in FIG. 4a is a schematic cross-sectional diagram of a microelectronics fabrication otherwise equivalent to the microelectronics fabrication whose schematic cross-sectional diagram is illustrated in FIG. 3, but wherein: (1) the patterned first photoresist layers 20a, 20b, 20c, and 20d are stripped from the microelectronics fabrication; and (2) the selectively ion implanted blanket second dielectric layer 16' is patterned to form a series of patterned second dielectric layers 16a, 16b, 16c, and 16d, while simultaneously forming a series of first apertures 25a, 25b, and 25c which access the corresponding contact regions 12a, 12b and 12c, while employing a second plasma 24 and at least the patterned hard mask layers 18a, 18b, 18c, and 18d as a second etch mask layer.

Within the preferred embodiment of the present invention, the second plasma 24 is the oxygen containing plasma within which neither the series of patterned first dielectric layers 14a, 14b, 14c, and 14d nor the blanket first hard mask layer 18 is susceptible to etching, but wherein: (1) the blanket second dielectric layer 16 is susceptible to etching; (2) the ion implanted portions of the selectively ion implanted blanket second dielectric layer 16' are more susceptible to etching than the non ion implanted portions of the selectively ion implanted blanket second dielectric layer 16'; and (3) the ion implanted portions of the selectively ion implanted blanket hard mask layer 18' may also be susceptible to etching.

Within the preferred embodiment of the present invention, the second plasma 24 preferably employs an oxygen containing etchant gas composition comprising an oxygen containing etchant gas selected from the group including but not limited to oxygen, ozone, nitrous oxide and nitric oxide. More preferably, the second plasma 24 employs an oxygen containing etchant gas comprising oxygen along with argon, where argon is employed as a sputter gas component. Preferably, the second plasma 24 is employed within a second plasma etch method which also employs: (1) a reactor chamber pressure of from about 20 to about 200 mtorr; (2) a radio frequency source power of from about 500 to about 1500 watts at a radio frequency of 13.56 MHZ; (3) a bias power of up to about 2000 watts; (4) an oxygen flow rate of from about 10 to about 50 standard cubic centimeters per minute (sccm); (5) an argon flow rate of from about 5 to about 50 standard cubic centimeters per minute (sccm); and (6) an optional helium and/or hexafluoroethane flow rate of from about 1 to about 5 standard cubic centimeters per minute (sccm) each.

Although as illustrated within the schematic cross-sectional diagram of FIG. 4a the patterned first photoresist layers 20a, 20b, 20c, and 20d are stripped from the microelectronics fabrication whose schematic cross sectional diagram is illustrated in FIG. 2 simultaneously with patterning the selectively ion implanted blanket second dielectric layer 16' to form the patterned second dielectric layers 16a, 16b, 16c and 16d, it is also feasible within the present invention that the patterned first photoresist layers 20a, 20b, 20c, and 20d may be stripped from the patterned first hard mask layers 18a, 18b, 18c, and 18d prior to patterning the selectively ion implanted blanket second dielectric layer 16' to form the patterned second dielectric layers 16a, 16b, 16c, and 16d while employing the second plasma 24. Under such circumstances there is typically employed for stripping the patterned first photoresist layers 20a, 20b, 20c, and 20d a wet chemical photoresist stripper which does not etch the selectively ion implanted blanket second dielectric layer 16'. Although such an independent stripping of the patterned first photoresist layers 20a, 20b, 20c, and 20d adds process complexity to the method of the present invention, the use of the patterned first hard mask layers 18a, 18b, 18c, and 18d alone as an etch mask layer in conjunction with the second plasma 24 will typically provide better definition of the series of first apertures 25a, 25b, and 25c which comprise: (1) a series of trenches corresponding with the series of first trenches 19a, 19b, and 19c defined by the series of patterned first photoresist layers 20a, 20b, 20c, and 20d; and (2) the series of first vias 15a, 15b, and 15c.

Under circumstances where the patterned first photoresist layers 20a, 20b, 20c, and 20d are stripped from the microelectronics fabrication whose schematic cross-sectional diagram is illustrated in FIG. 2 simultaneously with etching the selectively ion implanted blanket second dielectric layer 16' to form the patterned second dielectric layers 16a, 16b, 16c, and 16d, there is preferably employed within the preferred embodiment of the present invention a thickness of the patterned photoresist layers 20a, 20b, 20c, and 20d such that the patterned first photoresist layers 20a, 20b, 20c, and 20d are completely stripped from the corresponding patterned first hard mask layers 18a, 18b, 18c, and 18d without need for overetching the series of patterned second dielectric layers 16a, 16b, 16c, and 16d. Under such circumstances, optimal lateral dimensional integrity of the series of patterned second dielectric layers 16a, 16b, 16c, and 16d is facilitated. Similarly, the use of the argon sputtering gas component within the second plasma 24 also assists in facilitating optimal lateral dimensional integrity of the patterned second dielectric layers 16a, 16b, 16c, and 16d. Finally, the ion implanting of the selectively ion implanted blanket second dielectric layer 16' also assists in facilitating optimal lateral dimensional integrity of the patterned second dielectric layers 16a, 16b, 16c and 16d.

Finally, it is also noted that under circumstances where the ion implanted portions of the selectively ion implanted blanket hard mask layer 18' are sufficiently modified such that they may be etched within the second plasma 24, there may be omitted within the present invention the use of the first plasma 22. Under such circumstances, the patterned first photoresist layers 20a, 20b, 20c and 20d may still optionally be stripped from the microelectronics fabrication whose schematic cross-sectional diagram is illustrated in FIG. 2, typically employing a wet chemical stripper, prior to employing the second plasma 24 to form the series of patterned hard mask layers 18a, 18b, 18c and 18d, and the series of patterned second dielectric layers 16a, 16b, 16c and 16d.

Figure 4B:
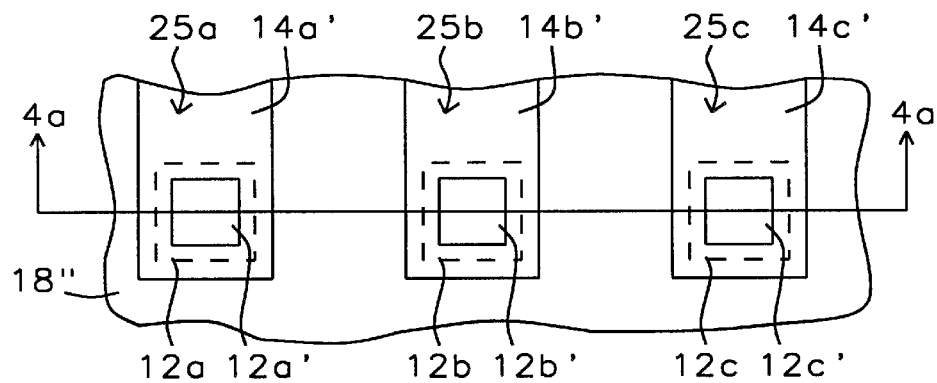

Referring now to FIG. 4b, there is shown a schematic plan-view diagram corresponding with the microelectronics fabrication whose schematic cross-sectional diagram is illustrated in FIG. 4a. Shown in FIG. 4b is a patterned hard mask layer 18" defining in part the series of first apertures 25a, 25b and 25c. Each of the first apertures 25a, 25b and 25c has formed therein a trench having as its floor a patterned first dielectric layers 14a", 14b" or 14c", where within each trench there is formed a via 15a, 15b or 15c accessing an exposed portion 12a', 12b' or 12c' of a corresponding contact region 12a, 12b or 12c.

Figure 5:
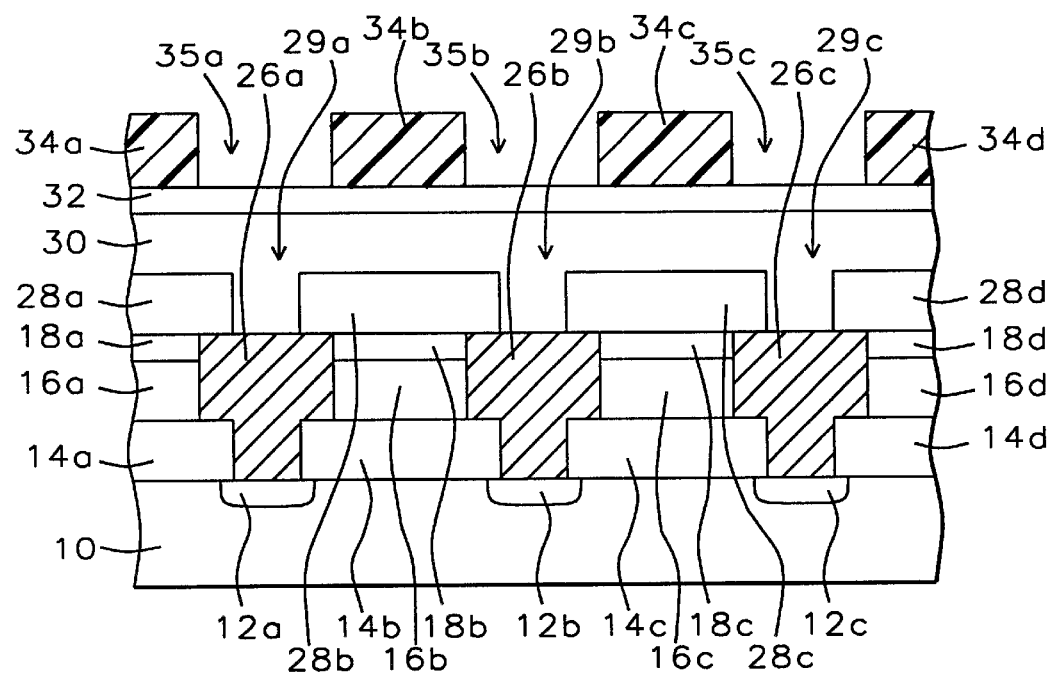

Referring now to FIG. 5, there is shown a schematic cross-sectional diagram illustrating the results of further processing of the microelectronics fabrication whose schematic cross-sectional diagram is illustrated in FIG. 4a. Shown in FIG. 5 is a schematic cross-sectional diagram of a microelectronics fabrication otherwise equivalent to the microelectronics fabrication whose schematic cross-sectional diagram is illustrated in FIG. 4a, but wherein there is formed into the series of first apertures 25a, 25b, and 25c a series of patterned planarized conductive contact stud layers 26a, 26b, and 26c contacting the respective contact regions 12a, 12b, and 12c within the substrate 10. Within the preferred embodiment of the present invention, the series of patterned planarized conductive contact stud layers 26a, 26b, and 26c is formed into the series of apertures 25a, 25b, and 25c preferably employing a damascene method. Within the damascene method, a blanket conductive contact stud layer is formed upon the patterned hard mask layers 18a, 18b, 18c, and 18d and into the first apertures 25a, 25b, and 25c, and subsequently planarized, typically employing an appropriate polishing method. For the preferred embodiment of the present invention, the patterned planarized conductive contact stud layers 26a, 26b, and 26c may be formed of any conductive material which is conventionally employed for forming conductive contact stud layers within the microelectronics fabrication within which is employed the substrate 10. Such conductive materials may include, but are not limited to metals, metal alloys, metal composites, metal alloy composites, doped polysilicon and polycides (doped polysilicon/metal silicide stacks), beneath and/or above which may optionally be formed barrier layers, as are conventional in the art of microelectronics fabrication. When employing metals and metal alloys for forming the patterned planarized conductive contact stud layers, there may be employed aluminum, aluminum alloy, copper, copper alloy, tungsten and tungsten alloy conductive materials.

Shown also in FIG. 5 formed upon the patterned first hard mask layers 18a, 18b, 18c, and 18d, and the patterned planarized conductive stud layers 26a, 26b, and 26c, is a series of patterned third dielectric layers 28a, 28b, 28c, and 28d which define a series of second vias 29a, 29b, and 29c which access portions of the corresponding patterned planarized conductive contact stud layers 26a, 26b, and 26c. Similarly, there is also shown in FIG. 5 formed upon the patterned third dielectric layers 28a, 28b, 28c, and 28d, and portions of the patterned planarized conductive contact stud layers 26a, 26b, and 26c exposed within the corresponding vias 29a, 29b, and 29c a blanket fourth dielectric layer 30. In addition, there is shown in FIG. 5 formed upon the blanket fourth dielectric layer 30 a blanket second hard mask layer 32. Finally, there is shown in FIG. 5 formed upon the blanket second hard mask layer 32 a series of patterned second photoresist layers 34a, 34b, 34c, and 34d.

Within the preferred embodiment of the present invention, the series of patterned third dielectric layers 28a, 28b, 28c, and 28d is preferably formed employing methods, materials and dimensions analogous or equivalent to the methods, materials and dimensions employed in forming the series of patterned first dielectric layers 14a, 14b, 14c, and 14d as illustrated within the schematic cross-sectional diagram of FIG. 1. Similarly, within the preferred embodiment of the present invention the blanket fourth dielectric layer 30 is preferably formed employing methods, materials and dimensions analogous or equivalent to the methods, materials, and dimensions employed in forming the blanket second dielectric layer 16 as illustrated within the schematic cross-sectional diagram of FIG. 1. In addition, within the second preferred embodiment of the present invention, the blanket second hard mask layer 32 is preferably formed employing methods, materials and dimensions analogous or equivalent to the methods, materials, materials, and dimensions employed in forming the blanket first hard mask layer 18 as illustrated within the schematic cross-sectional diagram of FIG. 1. Finally, within the second preferred embodiment of the present invention, the series of patterned second photoresist layers 34a, 34b, 34c, and 34d is preferably formed employing methods, materials and dimensions analogous or equivalent to the methods, materials and dimensions employed in forming the series of patterned first photoresist layers 20a, 20b, 20c, and 20d as illustrated within the schematic cross-sectional diagram of FIG. 1.

Figure 6:
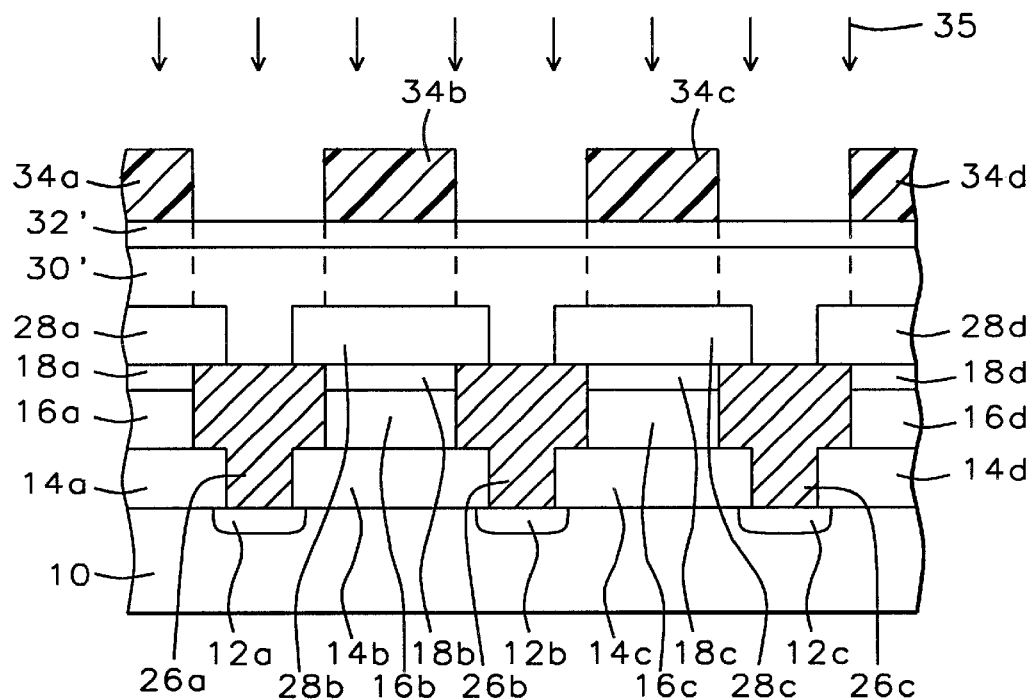

Referring now to FIG. 6, there is shown a schematic cross-sectional diagram illustrating the results of further processing of the microelectronics fabrication whose schematic cross-sectional diagram is illustrated in FIG. 5. Shown in FIG. 6 is a schematic cross-sectional diagram of a microelectronics fabrication otherwise equivalent to the microelectronics fabrication whose schematic cross-sectional diagram is illustrated within FIG. 5, but wherein portions of the blanket second hard mask layer 32 and the blanket fourth dielectric layer 30 have been ion implanted while employing a second ion implant treatment 35 and the series of patterned second photo resist layers 34a, 34b, 34c and 34d as a mask layer to form a selectively ion implanted blanket second hard mask layer 32' and a selectively ion implanted blanket fourth dielectric layer 30'.

Within the preferred embodiment of the present invention, the second ion implant treatment 35 preferably employs materials, parameters and limits analogous to the materials, parameters and limits employed when employing the first ion implant treatment 21 within the microelectronics fabrication whose schematic cross-sectional diagram is illustrated in FIG. 2. Thus, the selectively ion implanted blanket second hard mask layer 32' and the selectively ion implanted blanket fourth dielectric layer 30' as illustrated within the schematic cross-sectional diagram of FIG. 6 are formed analogously or equivalently with the selectively ion implanted blanket first hard mask layer 18' and the selectively ion implanted blanket second dielectric layer 16' within the microelectronics fabrication whose schematic cross-sectional diagram is illustrated in FIG. 2.

Figure 7:
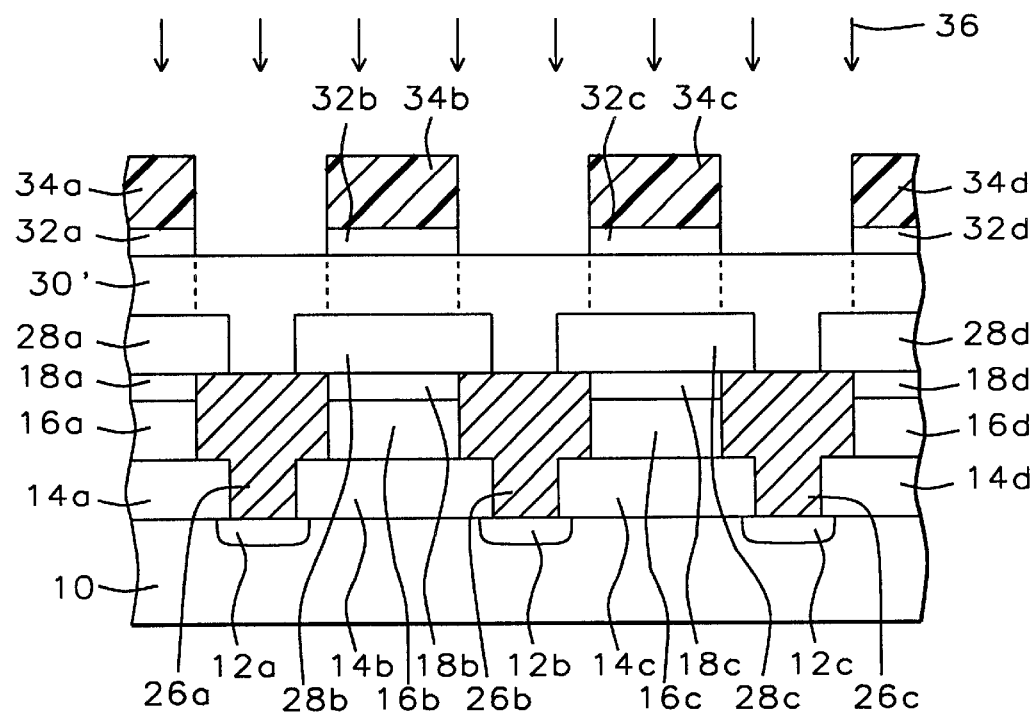

Referring now to FIG. 7, there is shown a schematic cross-sectional diagram illustrating the results of further processing of the microelectronics fabrication whose schematic cross-sectional diagram is illustrated in FIG. 6. Shown in FIG. 7 is a schematic cross-sectional diagram of a microelectronics fabrication otherwise equivalent to the microelectronics fabrication whose schematic cross-sectional diagram is illustrated in FIG. 6, but wherein the selectively ion implanted blanket second hard mask layer 32' has been patterned to form a series of patterned second hard mask layers 32a, 32b, 32c and 32d through etching with a third plasma 36 while employing the series of patterned second photoresist layers 34a, 34b, 34c, and 34d as a third etch mask layer. Within the preferred embodiment of the present invention, the third plasma 36 is preferably formed employing methods and materials analogous or equivalent to the methods and materials employed in forming the first plasma 22 as illustrated within FIG. 3. Thus, the series of patterned second hard mask layers 32a, 32b, 32c, and 32d as illustrated in FIG. 7 is formed analogously or equivalently with the series of patterned first hard mask layers 18a, 18b, 18c, and 18d as illustrated within the schematic cross-sectional diagram of FIG. 3.

Figure 8:
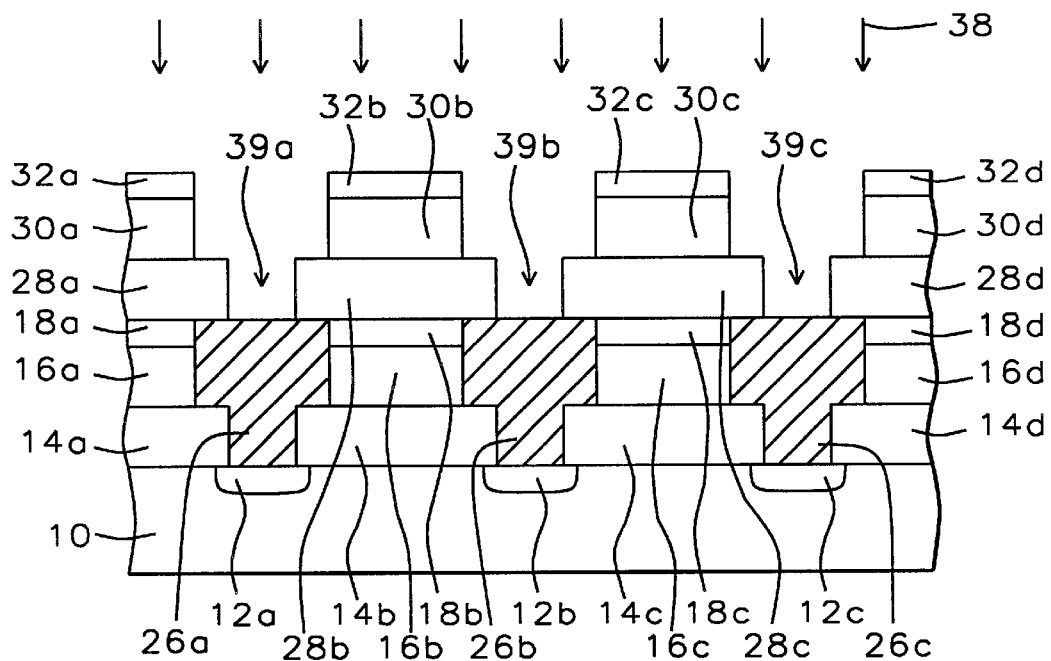

Referring now to FIG. 8, there is shown a schematic cross-sectional diagram illustrating the results of further processing of the microelectronics fabrication whose schematic cross-sectional diagram is illustrated in FIG. 7. Shown in FIG. 8 is a schematic cross-sectional diagram of a microelectronics fabrication otherwise equivalent to the microelectronics fabrication whose schematic cross-sectional diagram is illustrated in FIG. 7, but wherein: (1) the series of patterned second photoresist layers 34a, 34b, 34c and 34d has been stripped from the corresponding series of patterned second hard mask layers 32a, 32b, 32c, and 32d; and (2) there is formed from the selectively ion implanted blanket fourth dielectric layer 30' a series of patterned fourth dielectric layers 30a, 30b, 30c, and 30d which defines a series of second apertures 39a, 39b and 39c which access the series of patterned planarized conductor contact stud layers 26a, 26b, and 26c, while employing a fourth plasma 38 and at least the series of patterned second hard mask layers 32a, 32b, 32c, and 32d as a fourth etch mask layer. Within the preferred embodiment of the present invention, the fourth plasma 38 is preferably formed employing methods and materials analogous or equivalent to the methods and materials employed in forming the second plasma 24 as illustrated within the schematic cross-sectional diagram of FIG. 4a. Thus, the series of patterned fourth dielectric layers 30a, 30b, 30c, and 30d as illustrated within the schematic cross-sectional diagram of FIG. 8 is formed analogously or equivalently with the series of patterned second dielectric layers 16a, 16b, 16c, and 16d as illustrated within the schematic cross-sectional diagram of FIG. 4a.

Figure 9:
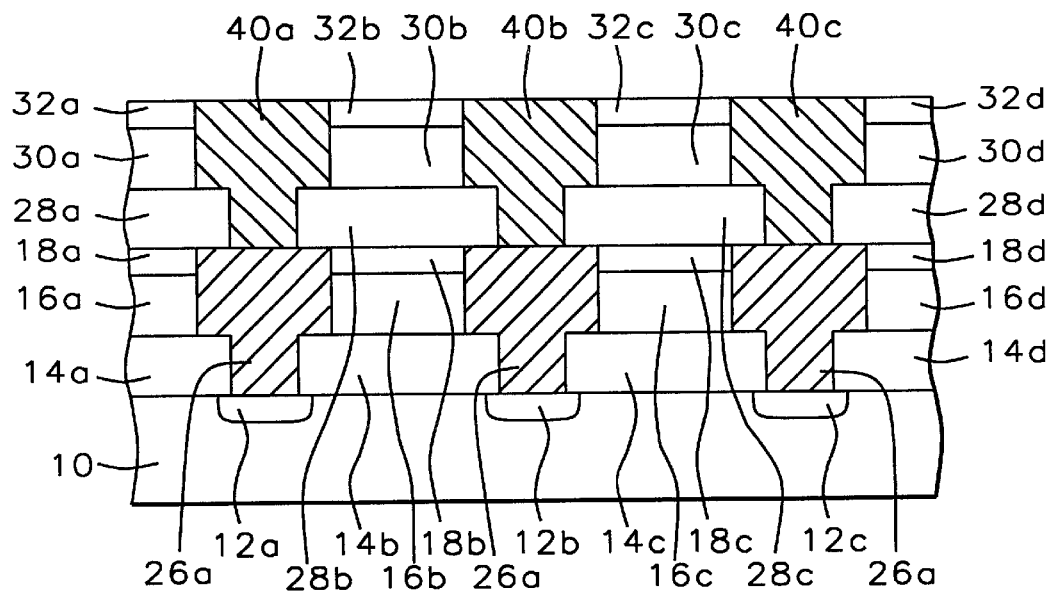

Referring now to FIG. 9, there is shown a schematic cross-sectional diagram illustrating the results of further processing of the microelectronics fabrication whose schematic cross-sectional diagram is illustrated in FIG. 8. Shown in FIG. 9 is a schematic cross-sectional diagram of a microelectronics fabrication otherwise equivalent to the microelectronics fabrication whose schematic cross-sectional diagram is illustrated in FIG. 8, but wherein there is formed within the series of second apertures 39a, 39b, and 39c a series of patterned planarized conductive interconnection stud layers 40a, 40b, and 40c. Within the preferred embodiment of the present invention, the series of patterned planarized conductive interconnection stud layers 40a, 40b, and 40c as illustrated within the schematic cross-sectional diagram of FIG. 9 is preferably formed employing methods, materials, and dimensions analogous or equivalent to the methods, materials, and dimensions employed in forming the series of patterned conductive contact stud layers 26a, 26b, and 26c as illustrated within the schematic cross-sectional diagram of FIG. 5.

Upon forming the microelectronics fabrication whose schematic cross-sectional diagram is illustrated in FIG. 9, there is formed a microelectronics fabrication having formed therein two series of low dielectric constant dielectric layers interposed between two series of patterned conductor interconnect layers which in turn are contiguous with and contacting two series of patterned conductor stud layers, with attenuated process complexity and with enhanced linewidth control.

EXAMPLES

There was obtained a series of semiconductor substrates and formed via spin coating and thermally curing at a temperature of about 400 degrees centigrade upon each semiconductor substrate within the series of semiconductor substrates a dielectric layer formed of a fluorinated polyarylene-ether dielectric material available from Allied-Signal Co. as FLARE™ 2.0 dielectric material. Each of the dielectric layers was formed to a thickness of about 5000 angstroms.

Similarly, there was also obtained a second series of semiconductor substrates and formed upon each semiconductor substrate within the second series of semiconductor substrates a silicon oxide dielectric layer formed employing a plasma enhanced chemical vapor deposition (PECVD) method in turn employing tetraethylorthosilicate (TEOS) as a silicon source material. The plasma enhanced chemical vapor deposition (PECVD) method also employed: (1) a reactor chamber pressure of about 2 torr; (2) a radio frequency power of about 400 watts at a radio frequency of 13.56 MHZ; (3) a tetraethylorthosilicate flow rate of about 900 standard cubic centimeters per minute (sccm) in a helium carrier gas flow rate of about 600 standard cubic centimeters per minute (sccm); and (4) an oxygen oxidant at a flow rate of about 1000 standard cubic centimeters per minute (sccm). Each of the silicon oxide dielectric layers was formed to a thickness of about 1000 angstroms.

Each of the fluorinated poly-arylene-ether dielectric layers and the silicon oxide dielectric layers was then ion implanted with a dopant ion under conditions as outlined within Table I. The ion implanted fluorinated poly-arylene-ether dielectric layers and the ion implanted silicon oxide dielectric layers were then etched within an oxygen and argon plasma which employed: (1) a reactor chamber pressure of about 30 mtorr, (2) a radio frequency power of about 500 watts at a source radio frequency of 13.56 MHZ; (3) a bias sputtering power of about 200 watts; (4) an oxygen flow rate of about 30 standard cubic centimeters per minute (sccm); and (5) an argon flow rate of about 20 standard cubic centimeters per minute (sccm).

There was then measured the amounts etched of ion implanted fluorinated poly-arylene-ether dielectric layers and the ion implanted silicon oxide dielectric layers while employing methods as are conventional in the art of microelectronics fabrication. Finally, there was also calculated therefrom etch rates for the ion implanted fluorinated poly-arylene-ether dielectric layers and ion implanted silicon oxide dielectric layers within the oxygen and argon plasma. For comparison purposes, a non ion implanted fluorinated poly-arylene-ether dielectric layer and a non ion implanted silicon oxide dielectric layer were similarly etched and their etch rates are also reported in Table I.

TABLE I

| Example | Dielectric | Ion Implant Conditions (dopant/energy/dose) | Etch Rate (A/min) |
|---|---|---|---|
| 1 | FLARE ™ | P/460kev/1E13 (twice) | 3820+/−20 |
| 2 | FLARE ™ | B/30kev/1.5E13 (twice) | 3960+/−20 |
| 3 | FLARE ™ | As/20kev/5E14 | 3900+/−20 |
| 4 | FLARE ™ | P/80kev/1.5E13 (twice) | 4160+/−20 |
| 5 | FLARE ™ | As/40kev/5.5E15 | 3760+/−20 |
| 6 | FLARE ™ | BF2/30kev/5.5E15 | 3780+/−20 |
| 7 | FLARE ™ | No I/I | 3800+/−20 |
| 8 | Si Oxide | P/460kev/1E13 (twice) | 120+/−2 |
| 9 | Si Oxide | B/30kev/1.5E13 (twice) | 120+/−2 |
| 10 | Si Oxide | As/40kev/5.5E15 | 160+/−2 |
| 11 | Si Oxide | No I/I | 120+/−2 |

As is seen from review of the data within Table I, there is observed under certain ion implant conditions significant increases of etch rate of ion implanted fluorinated poly-arylene-ether layer and ion implanted silicon oxide layers in comparison with non ion implanted flourinated poly-arylene-ether layers and non ion implanted silicon oxide layers, such that the present invention with respect to forming dual damascene patterned conductor enhanced linewidth control may be met.

As is understood by a person skilled in the art, the preferred embodiment and examples of the present invention are illustrative of the present invention rather than limiting of the present invention. Revisions and modifications may be made to methods, materials, structures, and dimensions through which may be formed microelectronics fabrications in accord with the preferred embodiment and examples of the present invention while still providing microelectronics fabrications formed in accord with the present invention, as defined by the appended claims.

What is claimed is:

1. A method for forming through a dielectric layer a trench contiguous with a via comprising:
    providing a substrate having a contact region formed therein;
    forming upon the substrate a patterned first dielectric layer, the patterned first dielectric layer defining a via accessing the contact region, the patterned first dielectric layer being formed of a first dielectric material which is not susceptible to etching with an oxygen containing plasma;
    forming upon the patterned first dielectric layer a blanket second dielectric layer, the blanket second dielectric layer completely covering the patterned first dielectric layer and filling the via, the blanket second dielectric layer being formed of a second dielectric material which is susceptible to etching within the oxygen containing plasma; there not being employed a hard mask layer formed upon the patterned first dielectric layer;
    forming upon the blanket second dielectric layer a blanket hard mask layer, the blanket hard mask layer being formed from a hard mask material which is not susceptible to etching within the oxygen containing plasma;
    forming upon the blanket hard mask layer a patterned photoresist layer, the patterned photoresist layer providing an exposed portion of the blanket hard mask layer greater than an areal dimension of the via and at least partially overlapping the areal dimension of the via;
    implanting into the exposed portion of the blanket hard mask layer and into a portion of the blanket second dielectric layer aligned beneath the exposed portion of the blanket hard mask layer a dose of an ion to form an ion implanted portion of the blanket hard mask layer and an ion implanted portion of the blanket second dielectric layer, where the ion implanted portion of the blanket second dielectric layer has an enhanced etch rate within the oxygen containing plasma in comparison with a non ion implanted portion of the blanket second dielectric layer;
    etching, while employing a first plasma etch method, the ion implanted portion of the blanket hard mask layer to form a patterned hard mask layer defining a first trench formed through the patterned hard mask layer while employing the patterned photoresist layer as a first etch mask layer, the first plasma etch method employing a first etchant gas composition appropriate to the ion implanted portion of the blanket hard mask layer; and
    etching, while employing a second plasma etch method, the blanket second dielectric layer to form a patterned second dielectric layer having an aperture formed therethrough, the aperture comprising:
    a second trench corresponding with the first trench; and
    at least a portion of the via, the second plasma etch method employing the oxygen containing plasma.

2. The method of claim 1 wherein by ion implanting the portions of the blanket hard mask layer and the blanket second dielectric layer the aperture is formed with enhanced linewidth control.

3. The method of claim 1 wherein the microelectronics fabrication is selected from the group consisting of semiconductor integrated circuit microelectronics fabrications, solar cell microelectronics fabrications, ceramic substrate microelectronics fabrications and flat panel display microelectronics fabrications.

4. The method of claim 1 wherein the first dielectric material selected from the group consisting of silicon oxide dielectric materials, silicon nitride dielectric materials and silicon oxynitride dielectric materials.

5. The method of claim 1 wherein the second dielectric material is an organic polymer spin-on-polymer dielectric material.

6. The method of claim 1 wherein the patterned photoresist layer is stripped from the microelectronics fabrication simultaneously with etching the blanket second dielectric layer to form the aperture through the patterned second dielectric layer.

7. The method of claim 1 wherein:
the ion implanted portion of the blanket hard mask layer is susceptible to etching within the oxygen containing plasma; and
the first plasma etch method and the second plasma etch method employ the oxygen containing plasma.

8. A microelectronics fabrication formed in accord with the method of claim 1.

9. A method for forming through a dielectric layer a patterned conductor interconnect layer contiguous with a patterned conductor stud layer comprising:
providing a substrate having a contact region formed therein;
forming upon the substrate a patterned first dielectric layer, the patterned first dielectric layer defining a via accessing the contact region, the patterned first dielectric layer being formed of a first dielectric material which is not susceptible to etching with an oxygen containing plasma;
forming upon the patterned first dielectric layer a blanket second dielectric layer, the blanket second dielectric layer completely covering the patterned first dielectric layer and filling the via, the blanket second dielectric layer being formed of a second dielectric material which is susceptible to etching within the oxygen containing plasma; there not being employed a hard mask layer formed upon the patterned first dielectric layer;
forming upon the blanket second dielectric layer a blanket hard mask layer, the blanket hard mask layer being formed from a hard mask material which is not susceptible to etching within the oxygen containing plasma;
forming upon the blanket hard mask layer a patterned photo resist layer, the patterned photo resist layer providing an exposed portion of the blanket hard mask layer greater that an areal dimension of the via and at least partially overlapping the areal dimension of the via;
implanting into the exposed portion of the blanket hard mask layer and into a portion of the blanket second dielectric layer aligned beneath the exposed portion of the blanket hard mask layer a dose of an ion to form an ion implanted portion of the blanket hard mask layer and an ion implanted portion of the blanket second dielectric layer, where the ion implanted portion of the blanket second dielectric layer has an enhanced etch rate within the oxygen containing plasma in comparison with a non ion implanted portion of the blanket second dielectric layer;
etching while employing a first plasma etch method, the ion implanted portion of the blanket hard mask layer to form a patterned hard mask layer defining a first trench formed through the patterned hard mask layer while employing the patterned photo resist layer as a first etch mask layer, the first plasma etch method employing a first etchant gas composition appropriate to the ion implanted portion of the blanket hard mask layer;
etching, while employing a second plasma etch method, the blanket second dielectric layer to form a patterned second dielectric layer having an aperture formed therethrough, the aperture comprising:
a second trench corresponding with the first trench; and
at least a portion of the via, the second plasma etch method employing the oxygen containing plasma; and
forming within the aperture a patterned conductor interconnect layer within the second trench contiguous with a patterned conductor stud layer within at least the portion of the via.

10. The method of claim 9 wherein by ion implanting the portions of the blanket hard mask layer and the blanket second dielectric layer the aperture is formed with enhanced linewidth control.

11. The method of claim 9 wherein the microelectronics fabrication is selected from the group consisting of semiconductor integrated circuit microelectronics fabrications, solar cell microelectronics fabrications, ceramic substrate microelectronics fabrications and flat panel display microelectronics fabrications.

12. The method of claim 9 wherein the first dielectric material selected from the group consisting of silicon oxide dielectric materials, silicon nitride dielectric materials and silicon oxynitride dielectric materials.

13. The method of claim 9 wherein the second dielectric material is an organic polymer spin-on-polymer dielectric material.

14. The method of claim 9 wherein the patterned photo resist layer is stripped from the microelectronics fabrication simultaneously with etching the blanket second dielectric layer to form the aperture through the patterned second dielectric layer.

15. The method of claim 9 wherein:
the ion implanted portion of the blanket hard mask layer is susceptible to etching within the oxygen containing plasma; and
the first plasma etch method and the second plasma etch method employ the oxygen containing plasma.

16. The method of claim 9 wherein the patterned conductor interconnect layer and contiguous patterned conductor stud layer are formed employing a damascene method.

17. A microelectronics fabrication formed in accord with the method of claim 9.

18. The method of claim 1, wherein the blanket second dielectric layer is formed from a dielectric material selected from the group consisting of FLARE 2.0, and silicon oxide dielectric material formed employing a PECVD method employing TEOS as a silicon source material.

19. The method of claim 1, wherein the blanket second dielectric layer has a thickness of about 5000 Å and is comprised of FLARE 2.0.

20. The method of claim 1, wherein the blanket second dielectric layer is formed from a silicon oxide dielectric material formed employing a PECVD method employing TEOS as a silicon source material within a reactor chamber having a pressure of about 2 torr, a radio frequency power of about 400 watts at a radio frequency of 13.56 MHz, a tetraethylorthosilicate (TEOS) flow rate of about 900 sccm in a helium carrier gas flow rate of about 600 sccm, and an oxygen oxidant at a flow rate of about 1000 sccm; the blanket second dielectric layer having a thickness of about 1000 Å.

21. The method of claim 1, wherein the blanket second dielectric layer has an etch rate ratio within the oxygen containing plasma with respect to the patterned first dielectric layer of greater than about 20:1.

22. The method of claim 1, wherein the blanket second dielectric layer has an etch rate ratio within the oxygen containing plasma with respect to the patterned first dielectric layer of greater than about 30:1.

23. The method of claim 1, wherein the blanket second dielectric layer has an etch rate ratio within the oxygen containing plasma with respect to the patterned first dielectric layer of greater than about 50:1.

24. The method of claim 1, wherein the blanket hard mask layer is from about 500 to 2000 Å thick and the patterned photoresist layer is from 7000 to 15,000 Å thick.

25. The method of claim 1, wherein the implanted ions are selected from the group comprising boron difluoride ions, phosphorus ions, and arsenic ions; and the ion implant dosage is from about 1E15 to 1E16 at an ion implantation energy of from about 30 to 200 keV.

26. The method of claim 1, wherein the blanket hard mask is comprised of CVD silicon oxide dielectric material, and the first plasma etch method employs an etchant gas composition which upon plasma activation provides a fluorine containing etchant species.

27. The method of claim 1, wherein the blanket hard mask is comprised of CVD silicon oxide dielectric material, and the first plasma etch method employs a carbon tetrafluoride containing etchant gas composition including trifluoromethane and an argon gas dilutant.

28. The method of claim 1, wherein the second plasma method includes an oxygen containing etchant gas selected from the group comprising oxygen, ozone, nitrous oxide and nitric oxide.

29. The method of claim 1, wherein the second plasma method employs an oxygen containing etchant gas with argon as a sputter gas component within an reactor chamber at the parameters: a pressure of from about 20 to 200 mTorr; a radio frequency power of from about 500 to 1500 watts at a source radio frequency of 13.56 MHz; a bias power of up to about 2000 watts; an oxygen flow rate of from about 10 to 50 sccm; and an argon flow rate of from about 5 to 50 sccm.

30. The method of claim 9, wherein the blanket second dielectric layer is formed from a dielectric material selected from the group consisting of FLARE 2.0, and silicon oxide dielectric material formed employing a PECVD method employing TEOS as a silicon source material.

31. The method of claim 9, wherein the blanket second dielectric layer has a thickness of about 5000 Å and is comprised of FLARE 2.0.

32. The method of claim 9, wherein the blanket second dielectric layer is formed from a silicon oxide dielectric material formed employing a PECVD method employing TEOS as a silicon source material within a reactor chamber having a pressure of about 2 torr, a radio frequency power of about 400 watts at a radio frequency of 13.56 MHz, a tetraethylorthosilicate (TEOS) flow rate of about 900 sccm in a helium carrier gas flow rate of about 600 sccm, and an oxygen oxidant at a flow rate of about 1000 sccm; the blanket second dielectric layer having a thickness of about 1000 Å.

33. The method of claim 9, wherein the blanket second dielectric layer has an etch rate ratio within the oxygen containing plasma with respect to the patterned first dielectric layer of greater than about 20:1.

34. The method of claim 9, wherein the blanket second dielectric layer has an etch rate ratio within the oxygen containing plasma with respect to the patterned first dielectric layer of greater than about 30:1.

35. The method of claim 9, wherein the blanket second dielectric layer has an etch rate ratio within the oxygen containing plasma with respect to the patterned first dielectric layer of greater than about 50:1.

36. The method of claim 9, wherein the blanket hard mask layer is from about 500 to 2000 Å thick and the patterned photoresist layer is from 7000 to 15,000 Å thick.

37. The method of claim 9, wherein the implanted ions are selected from the group comprising boron difluoride ions, phosphorus ions, and arsenic ions; and the ion implant dosage is from about 1E15 to 1E16 at an ion implantation energy of from about 30 to 200 keV.

38. The method of claim 9, wherein the blanket hard mask is comprised of CVD silicon oxide dielectric material, and the first plasma etch method employs an etchant gas composition which upon plasma activation provides a fluorine containing etchant species.

39. The method of claim 9, wherein the blanket hard mask is comprised of CVD silicon oxide dielectric material, and the first plasma etch method employs a carbon tetrafluoride containing etchant gas composition including trifluoromethane and an argon gas dilutant.

40. The method of claim 9, wherein the second plasma method includes an oxygen containing etchant gas selected from the group comprising oxygen, ozone, nitrous oxide and nitric oxide.

41. The method of claim 9, wherein the second plasma method employs an oxygen containing etchant gas with argon as a sputter gas component within an reactor chamber at the parameters: a pressure of from about 20 to 200 mTorr; a radio frequency power of from about 500 to 1500 watts at a source radio frequency of 13.56 MHz; a bias power of up to about 2000 watts; an oxygen flow rate of from about 10 to 50 sccm; and an argon flow rate of from about 5 to 50 sccm.

42. A method for forming through a dielectric layer a trench contiguous with a via comprising:

providing a substrate having a contact region formed therein;

forming upon the substrate a patterned first dielectric layer, the patterned first dielectric layer defining a via accessing the contact region, the patterned first dielectric layer being formed of a first dielectric material which is not susceptible to etching with an oxygen containing plasma;

forming upon the patterned first dielectric layer a FLARE 2.0 blanket second dielectric layer, the blanket second dielectric layer completely covering the patterned first dielectric layer and filling the via, the blanket second dielectric layer being formed of a second dielectric material which is susceptible to etching within the oxygen containing plasma; there not being employed a hard mask layer formed upon the blanket first dielectric layer; the blanket second dielectric layer having an etch rate ratio within the oxygen containing plasma with respect to the patterned first dielectric layer of greater than about 20:1; the blanket second dielectric layer having a thickness of about 5000 Å;

forming upon the blanket second dielectric layer a blanket hard mask layer having a thickness of from about 500 to 2000 Å, the blanket hard mask layer being formed from a hard mask material which is not susceptible to etching within the oxygen containing plasma;

forming upon the blanket hard mask layer a patterned photoresist layer having a thickness from about 7000 to 15,000 Å, the patterned photoresist layer providing an exposed portion of the blanket hard mask layer greater than an areal dimension of the via and at least partially overlapping the areal dimension of the via;

implanting into the exposed portion of the blanket hard mask layer and into a portion of the blanket second dielectric layer aligned beneath the exposed portion of the blanket hard mask layer a dose of an ion to form an ion implanted portion of the blanket hard mask layer and an ion implanted portion of the blanket second dielectric layer, where the ion implanted portion of the blanket second dielectric layer has an enhanced etch rate within the oxygen containing plasma in comparison with a non ion implanted portion of the blanket second dielectric layer; the implanted ions being selected from the group comprising boron difluoride ions, phosphorus ions, and arsenic ions; the ion implant dosage being from about 1E15 to 1E16 at an ion implantation energy of from about 30 to 200 keV;

etching, while employing a first plasma etch method, the ion implanted portion of the blanket hard mask layer to form a patterned hard mask layer defining a first trench formed through the patterned hard mask layer while employing the patterned photoresist layer as a first etch mask layer, the first plasma etch method employing a first etchant gas composition appropriate to the ion implanted portion of the blanket hard mask layer; and etching, while employing a second plasma etch method, the blanket second dielectric layer to form a patterned second dielectric layer having an aperture formed therethrough; the second plasma etch method including an oxygen containing etchant gas selected from the group comprising oxygen, ozone, nitrous oxide and nitric oxide; the aperture comprising:

a second trench corresponding with the first trench; and at least a portion of the via, the second plasma etch method employing the oxygen containing plasma.

43. The method of claim 42, wherein the blanket second dielectric layer has an etch rate ratio within the oxygen containing plasma with respect to the patterned first dielectric layer of greater than about 30:1.

44. The method of claim 42, wherein the blanket second dielectric layer has an etch rate ratio within the oxygen containing plasma with respect to the patterned first dielectric layer of greater than about 50:1.

45. The method of claim 42, wherein the second plasma method employs an oxygen containing etchant gas with argon as a sputter gas component within an reactor chamber at the parameters: a pressure of from about 20 to 200 mtorr; a radio frequency power of from about 500 to 1500 watts at a source radio frequency of 13.56 MHz; a bias power of up to about 2000 watts; an oxygen flow rate of from about 10 to 50 sccm; and an argon flow rate of from about 5 to 50 sccm.

* * * * *